(12) United States Patent
Lee et al.

(10) Patent No.: US 7,834,840 B2
(45) Date of Patent: Nov. 16, 2010

(54) LIQUID CRYSTAL DISPLAY DEVICE INCLUDING TRANSFORMER

(75) Inventors: Yong-Kon Lee, Seoul (KR); Jae-Ho Lee, Dong-gu Daegu (KR)

(73) Assignee: LG Display Co., Ltd., Seoul (KR)

( * ) Notice: Subject to any disclaimer, the term of this patent is extended or adjusted under 35 U.S.C. 154(b) by 1175 days.

(21) Appl. No.: 11/476,658

(22) Filed: Jun. 29, 2006

(65) Prior Publication Data

US 2007/0165151 A1    Jul. 19, 2007

(30) Foreign Application Priority Data

Dec. 29, 2005    (KR) .................. 10-2005-0133534

(51) Int. Cl.
*G09G 3/36* (2006.01)

(52) U.S. Cl. ...................... 345/102; 345/212

(58) Field of Classification Search ................. 345/204, 345/211–213, 102
See application file for complete search history.

(56) References Cited

U.S. PATENT DOCUMENTS 6,611,190 B2 *   8/2003   Chui et al. .................. 336/198

| | | | | |
|---|---|---|---|---|
| 2004/0196131 A1 * | 10/2004 | Wu et al. | ..................... | 336/212 |
| 2007/0058376 A1 | 3/2007 | Suzuki | | |
| 2007/0103163 A1 * | 5/2007 | Hachisuka et al. | .......... | 324/500 |

FOREIGN PATENT DOCUMENTS

| CN | 1210345 A | 3/1999 |
|---|---|---|
| CN | 1534697 A | 10/2004 |
| CN | 1704810 A | 12/2005 |
| JP | 56-26935 U | 3/1981 |
| JP | 11-345724 A | 12/1999 |
| JP | 2003-107463 A | 4/2003 |
| JP | 2005-134919 A | 5/2005 |
| JP | 2007-73474 A | 3/2007 |

* cited by examiner

*Primary Examiner*—Ricardo L Osorio
(74) *Attorney, Agent, or Firm*—Birch Stewart Kolasch & Birch, LLP

(57) ABSTRACT

A liquid crystal display device including a liquid crystal display panel, a printed circuit board connected to the liquid crystal display panel, a transformer connected to the printed circuit board, and a ferrite core plate disposed between the printed circuit board and the transformer.

16 Claims, 4 Drawing Sheets

LIQUID CRYSTAL DISPLAY DEVICE INCLUDING TRANSFORMER

The present invention claims the benefit of Korean Patent Application No. 2005-0133534, filed in Korea on Dec. 29, 2005, which is hereby incorporated by reference.

BACKGROUND OF THE INVENTION

1. Field of the Invention

The present invention relates to a liquid crystal display (LCD) device, and more particularly to an LCD device having a transformer and a ferrite core plate disposed between a printed circuit board and the transformer.

2. Discussion of the Related Art

Flat panel display (FPD) devices have a relatively light weight, a thin profile, and low power consumption characteristics are and thus are commonly used instead of cathode ray tube (CRT) devices. Further, display devices are generally classified into emissive display devices and non-emissive display devices. In more detail, emissive display devices display images by emitting light themselves, while the non-emissive display devices require an additional light source because they do not emit light by themselves. For example, plasma display panel (PDP) devices, field emission display (FED) devices, and electroluminescent display (ELD) devices are classified as emissive display devices. Further, LCD devices are classified as non-emissive display devices and are commonly used in notebook and desktop computers because of their high resolution, capability of displaying colored images, and high quality image display.

In addition, the LCD devices include an LCD panel for displaying images and a backlight unit for supplying light to the LCD panel. The LCD panel includes two substrates facing each other with a liquid crystal material interposed therebetween. Further, liquid crystal molecules of the liquid crystal material have dielectric constant and refractive index anisotropic characteristics due to their long, thin shape, and an orientation of the liquid crystal molecules is controlled via a voltage applied to electrodes formed on each substrate. Thus, a transmittance of the LCD panel is changed according to polarization properties of the liquid crystal material.

Also, a backlight unit is used as the additional light source for the LCD panel and is disposed under the LCD panel such that the LCD device displays images using light produced by the backlight unit. In addition, backlight units are generally classified as a side-type backlight unit and a direct-type backlight unit. The direct-type backlight unit includes a plurality of light sources and is commonly used to provide an increased brightness.

Further, discharge lamps such as a cold cathode fluorescent lamp (CCFL) or an external electrode fluorescent lamp (EEFL) are used as light sources in the backlight unit. Light emitting diodes (LEDs) are also being used more often as the light source of the backlight unit to improve a color reproducibility and to increase a brightness of the display.

In more detail, FIG. 1 is a cross-sectional view showing a direct type LCD module 1 according to the related art. As shown, the LCD module 1 includes an LCD panel 10 and a backlight unit 20. Further, the LCD panel 10 includes first and second substrates (not shown) facing each other with a liquid crystal layer (not shown) therebetween. The backlight unit 20 is also disposed under the LCD panel 10.

The LCD module 1 also includes a main frame 40 supporting edges of the LCD panel 10 and the backlight unit 20, a top frame 60 supporting a front edge of the LCD panel 10, and a bottom frame 50 covering a backside of the backlight unit 20.

As shown, the backlight unit 20 includes a reflective sheet 22 covering an inner surface of the bottom frame 50, a plurality of fluorescent lamps 24 arranged in parallel to each other on a front surface of the backlight unit 20, and a plurality of optical sheets 28 between the plurality of fluorescent lamps 24 and the LCD panel 10. In addition, the LCD panel 10 receives light emitted from the plurality of fluorescent lamps 24, in which the light is modified so as to have a uniform brightness.

Further, a backlight driving circuit (not shown) is disposed on a printed circuit board 70 and is used for driving the fluorescent lamp 24. In more detail, the backlight unit driving circuit includes an inverter (not shown) for turning the fluorescent lamp 24 ON and OFF. The inverter includes at least one transformer 72 that amplifies and outputs an alternating current (AC) input voltage. In addition, as shown in FIG. 1, the printed circuit board 70 having the backlight driving circuit is closely adhered with the bottom frame 50 via a bended portion bending back toward a backside of the bottom frame 50.

Further, the plurality of fluorescent lamps 24 are arranged in a row, which reduces the required number of the invertors and lowers the production cost of the LCD panel. However, with the increase of fluorescent lamps, the capacity of the transformer 72 is also increased. For example, the capacity of the transformer 72 for a 32 inch display is about 65 Watts more than the related art value of about 10 Watts.

Furthermore, when the capacity of the transformer 72 is increased, a leakage magnetic field from the transformer 72 is also increased. In more detail, an exothermic phenomenon under a high temperature occurs due to an eddy current in the adjacent bottom frame 50 and a consumption power is increased, which reduces an efficiency of the transformer 72. Particularly, the leakage magnetic field is increased because the bottom frame 50 is generally formed of a steel material such as electro-galvanized iron (EGI).

SUMMARY OF THE INVENTION

Accordingly, one object of the present invention is to address the above noted and other problems.

Another object of the present invention is to reduce a leakage magnetic field of a transformer.

Yet another object of the preset invention is to prevent an unnecessary consumption power of the LCD panel and a rise in temperature of the bottom frame with a capacity increase of the transformer.

To achieve these and other advantages and in accordance with the purpose of the present invention, as embodied and broadly described, the present invention provides in one aspect, a liquid crystal display device including a liquid crystal display panel, a printed circuit board connected to the liquid crystal display panel, a transformer connected to the printed circuit board, and a ferrite core plate disposed between the printed circuit board and the transformer.

In another aspect, the present invention provides a method of manufacturing a liquid crystal display device including connecting a printed circuit board to a liquid crystal display panel, attaching a transformer on the printed circuit board; and placing a ferrite core plate between the printed circuit board and the transformer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments of the present invention, examples of which are illustrated in the accompanying drawings.

Figure 1:
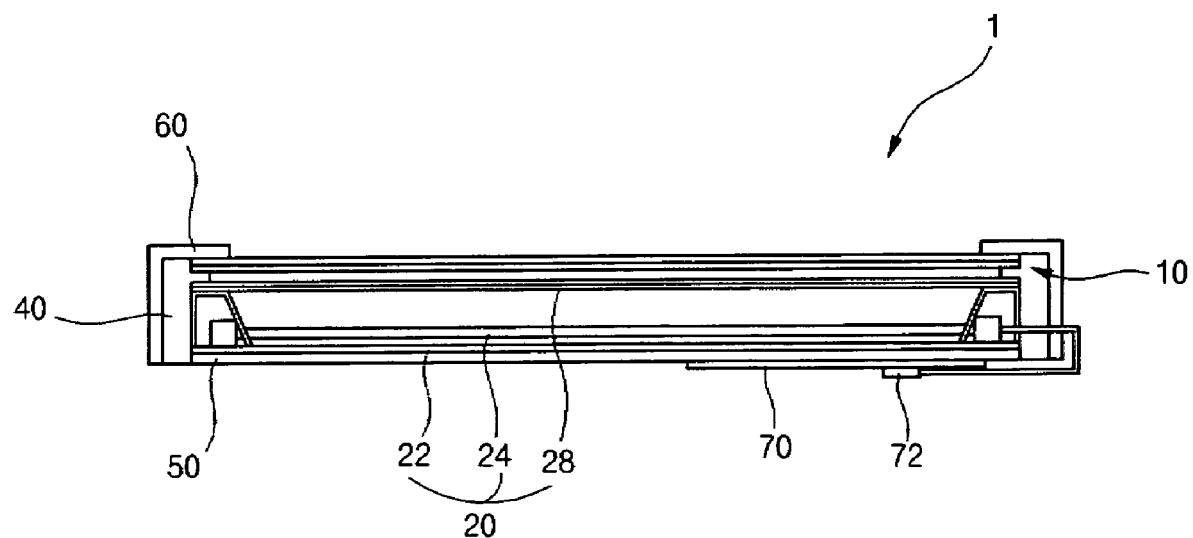
FIG. 1 is a cross-sectional view showing a direct type LCD module according to the related art.
Figure 2:
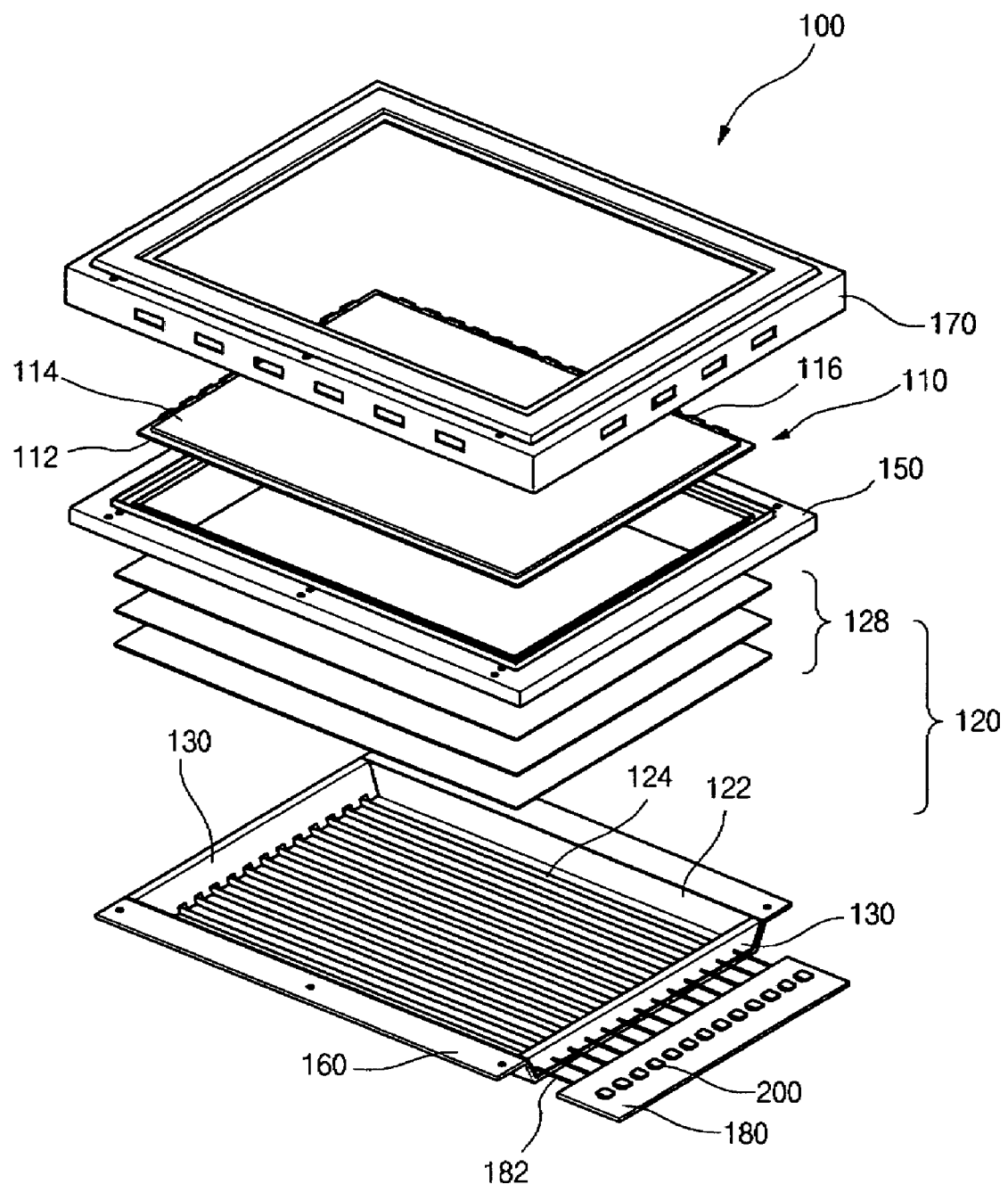
FIG. 2 is an assembly view of an LCD module according to an embodiment of the present invention.

First, FIG. 2 is an assembly view of an LCD module 100 according to an embodiment of the present invention. As shown, the LCD module 100 includes an LCD panel 110, a backlight unit 120, and mechanical structural elements to protect components of the module 100 and to prevent light leakage from the assembled LCD module 100.

In addition, the backlight unit 120 is located under the LCD panel 110. The LCD module 100 also includes a main frame 150 surrounding edges of the LCD panel 110 and the backlight unit 120, and a bottom frame 160 to provide structural support and to prevent light leakage from the backlight unit 120 when the bottom frame 160 is combined with the main frame 150. Further, the main frame 150 is preferably square or rectangular, and is made of steel or a poly mold material.

In addition, as shown in FIG. 2, the LCD module 100 also includes a top frame 170 surrounding a front edge of the LCD panel 110. Thus, the LCD module 100 is totally assembled and combined using the main frame 150, the bottom frame 160, and the top frame 170. Also, the LCD panel 110 includes first and second substrates 112 and 114 and a liquid crystal layer (not shown) therebetween.

Further, although not shown, the first substrate 112 includes a gate line, a data line crossing the gate line thereby defining a pixel region, a thin film transistor (TFT) at the crossing position of the gate line and the data line and a pixel electrode connected to the thin film transistor. In addition, the second substrate 114 includes a color filter layer having red, green and blue sub-color filters repeatedly arranged, and a black matrix in a non-pixel periphery region of the pixel region.

In addition, a driving circuit (not shown) is connected to an edge of the LCD panel 110 through one of a flexible circuit substrate and a tape carrier package. The driving circuit is also pulled back toward a side surface of the main frame 150 or a backside of the bottom frame 160. Further, the driving circuit includes a gate driving circuit for providing a scanning signal to the gate line and a data driving circuit. The gate and data driving circuits may also be arranged adjacent to each other.

Thus, when the TFT is turned ON via a respective gate line, the corresponding data signal is applied to the data line. Accordingly, an arrangement direction of the molecules included in the liquid crystal can be changed due to a vertical electric field applied between the pixel electrode and the common electrode so as to provide a transmittance difference.

Further, to achieve a particular brightness based on the transmittance difference, the backlight unit 120 is disposed under the LCD panel 110. As shown in FIG. 2, the backlight unit 120 includes a reflective sheet 122, a plurality of fluorescent lamps 124 arranged in parallel to each other, and a plurality of optical sheets 128 between the fluorescent lamps 124 and the LCD panel 110. Further, the plurality of fluorescent lamps 124 are fixed via a couple of auxiliary bottom frames 130 attached to the bottom frame 160.

Specifically, the auxiliary bottom frames 130 are fixed to two edges of the bottom frames 160. Also, the other two edges of the bottom frame 160 extend toward the LCD panel 110 frame 160 such that the backlight unit 120 can be disposed in the extended portion of the other edges of the bottom frame 160. Accordingly, light from the fluorescent lamp 124 and reflected light from the reflective sheet 124 can be uniformly processed through the optical sheets 128 when the light passes through the LCD panel 110.

In addition, a backlight driving circuit (not shown) is connected to the fluorescent lamp 124 through a cable used to drive the fluorescent lamp 124 and is disposed on the printed circuit board 180. The backlight driving circuit is pulled back toward a backside of the bottom frame 160 so as to reduce a packaging space. In addition, as shown in FIG. 2, at least one transformer 200 is disposed within the packaging space. Thus, the transformer 200 is closely arranged with the bottom frame 160 with the printed circuit board 180 disposed therebetween.

Figure 3A:
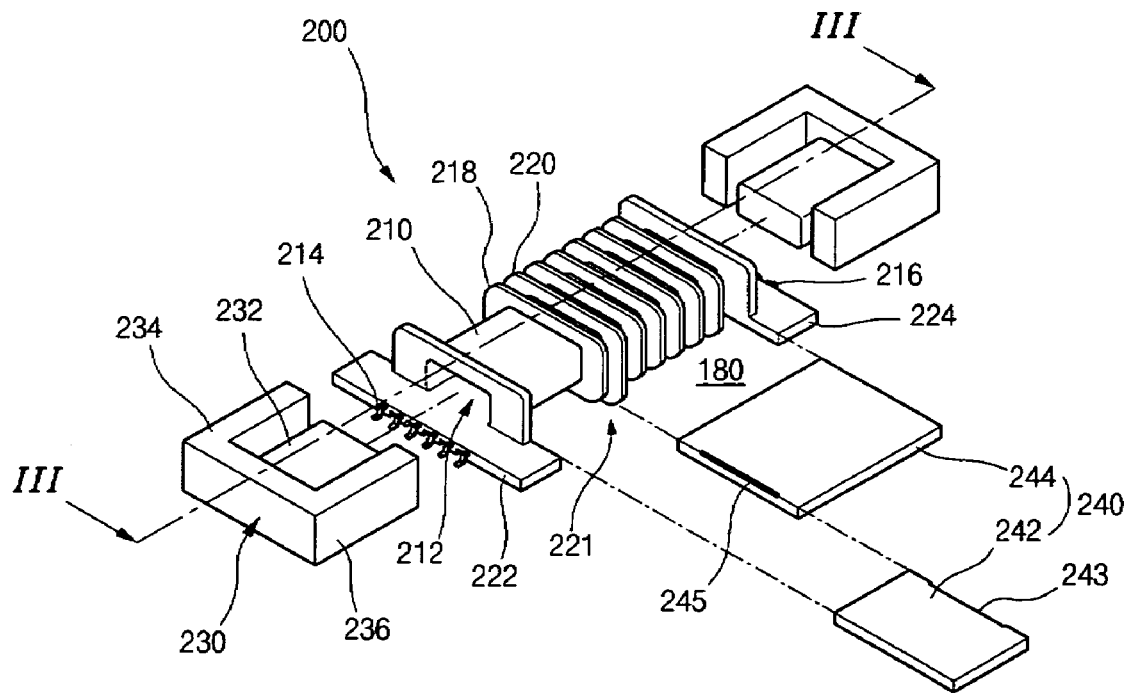
FIG. 3A is an exploded perspective view of a transformer for an LCD module according to a first embodiment of the present invention.
Figure 3B:
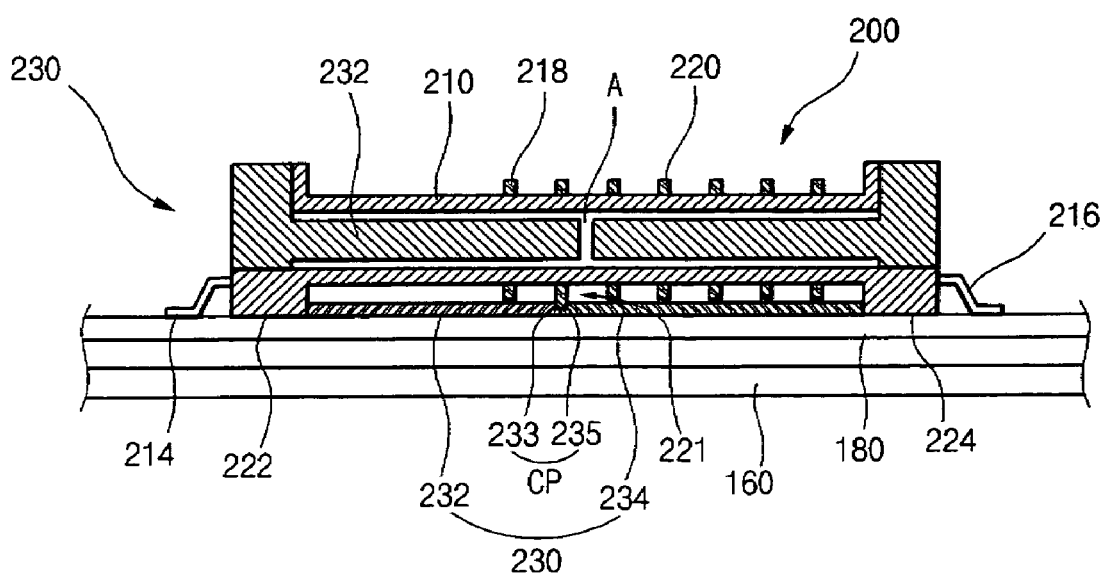
FIG. 3B is a cross-sectional view taken along a line III-III in FIG. 3A.

Turning next to FIG. 3A, which is an exploded perspective view of the transformer 200 for the LCD module 100 according to a first embodiment of the present invention and FIG. 3B, which is a schematic cross-sectional view taken along a line III-III of FIG. 3A. For convenience sake, a bottom portion of the LCD module 100 is also illustrated.

As shown in FIGS. 3A and 3B, the transformer 200 includes a bobbin 210 on the printed circuit board 180 and a hollow portion 212 along a lengthwise direction of the bobbin 210. Also included is a primary coil (not shown) and a secondary coil (not shown) rolled on an outside the bobbin 210, first and second lead substrates 222 and 224 extending from first and second edges of the bobbin 210, respectively, in which the first and second lead substrates 222 and 224 have a space where a plate 240 is disposed. In addition, the transformer 200 includes a primary lead pin 214, a secondary lead pin 216 extending from the first and second lead substrates 222 and 224, and a couple of E-cores 230 inserted into the hollow portion 212 from the first and second edges.

Further, a ring shaped sidewall 218 surrounds the outside of the bobbin 210 at a central position of the bobbin 210 to separate the primary coil and the secondary coil. In addition, a plurality of ring shaped coil sidewalls 220 surround a region that the secondary coil surrounds the bobbin 210. As shown, the plurality of ring shaped coil sidewalls 220 are arranged in parallel to each other.

Also, when the first and second lead substrates 222 and 224 are disposed on the printed circuit board 180 and the primary and secondary lead pins 214 and 216 are connected to the first and second lead substrates 222 and 224 by soldering, for example, the ring shaped sidewall 218 and the coil sidewall 220 are disposed at a predetermined space from the printed circuit board 180.

In addition, the E-cores 230 have an air gap "A" therebetween in the hollow portion 212 and a center post directly inserted into the hollow portion 212. Further, the E-cores 230 include first and second side posts 234 and 236. Thus, when the E-cores 230 are inserted into the hollow portion 212 from the first and second edges, the air gap "A" between the couple of E-cores 230 in the hollow portion 212 is defined. In addition, the transformer 200 is preferably an EE type transformer.

Also, the plate 240 is formed to shield a leakage magnetic field of the transformer 200. More particularly, the plate 240 has a structure so as to completely overlap a region of the air gap "A" by being interposed between the bobbin 210 and the printed circuit board 180. Therefore, the transformer 200 has a stable fixing structure even if an external impulse occurs.

Further, the plate 240 may be formed of a magnetic material such as "MO" and "FeO." That is, M includes a bivalent metal group including magnesium (Mg), nickel (Ni) and zinc (Zn). In addition, the ferrite plate is formed via plasticizing and grinding a compound of a ferrite oxide or a ferrite carbonate, and molding the compound by compressing and sintering the compound under the high temperature. The plate 240 is then processed to form a thin film.

In addition, the magnetic permeability of the plate is about 20 to 800 to provide a greater resistance and stability regarding a temperature change. Thus, the plate 240 effectively shields a leakage magnetic field by be being interposed between the transformer 200 and the printed circuit board 180. Further, at least one of the plurality of coil sidewalls 220 has an extended portion 221 so that a first distance between the extended portion 221 and the printed circuit board 180 is smaller than a second distance between each of the plurality of coil sidewalls 220.

Further, as shown in FIG. 3A, the plate 240 includes first and second plates 242 and 244, in which the extended portion 221 contacts a first position facing the first and second plates 242 and 244. In other words, the first plate 242 is disposed between the first lead substrate 222 and the extended portion 221, and the second plate 244 is disposed between the second lead substrate 244 and the extended portion 221.

Also, the first and second plates 242 and 244 have a concave portion "CP" so that the extended portion 221 can be inserted into the concave portion "CP." Specifically, the concave portion "CP" includes a first concave portion 243 of the first plate 242 and a second concave portion 245 of the second plate 244.

Figure 4A:
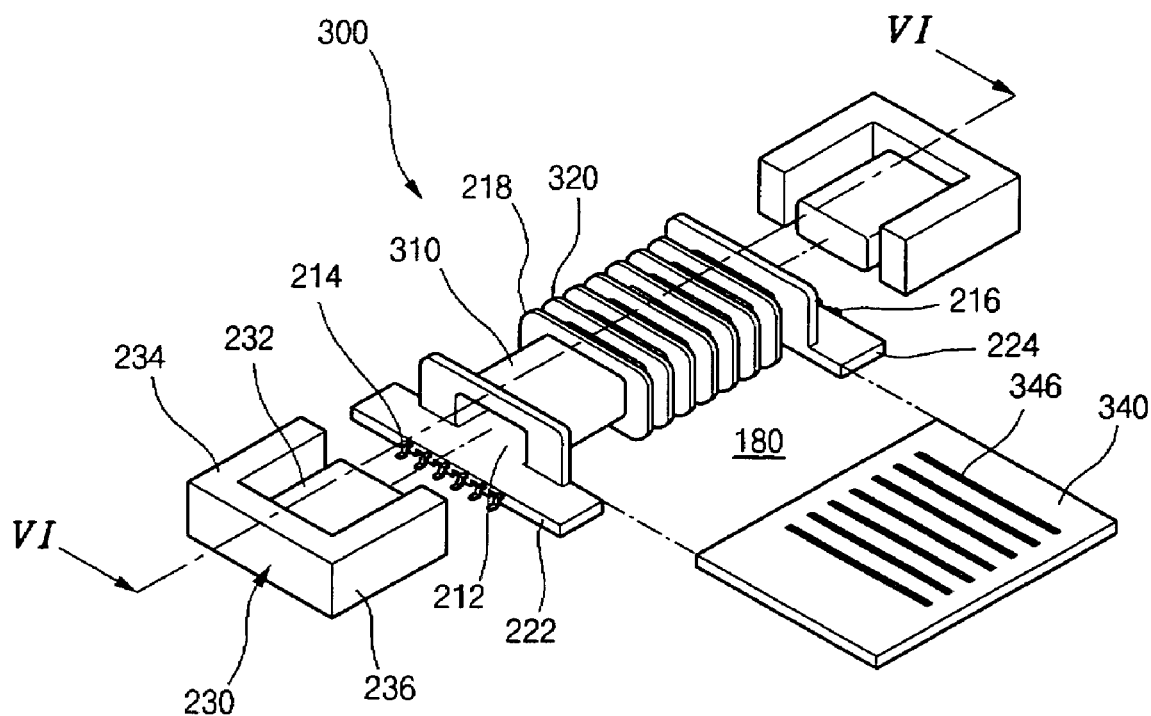
FIG. 4A is an exploded perspective view of a transformer for an LCD module according to a second embodiment of the present invention.
Figure 4B:
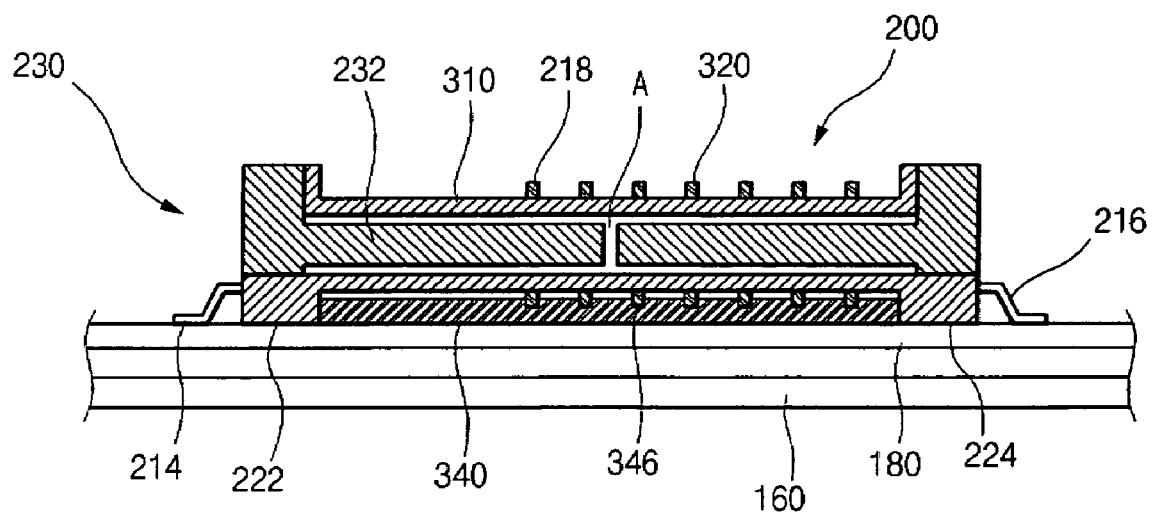
FIG. 4B is a cross-sectional view taken along a line IV-IV in FIG. 4A.

Turning now to FIG. 4A, which is an exploded perspective view of a transformer 300 for the LCD module 100 according to a second embodiment of the present invention, and FIG. 4B, which is a schematic cross-sectional view taken along a line IV-IV of FIG. 4A.

This embodiment includes a plate 340 formed with a single body (different from the two bodies in the first embodiment). Further, the plate 340 includes a plurality of concave portions 346 having a same number as a plurality of coil sidewalls 320 so that each concave portion 346 corresponds to each coil sidewall 320. Accordingly, the plate 340 may be inserted into an outside of a bobbin 310 such that each concave portion 346 is inserted into each coil sidewall 320 by pushing or sliding in the bobbin 310.

Thus, in accordance with the present invention, the LCD module 100 can be effectively shielded from the leakage magnetic field of the transformer adjacent to the bottom frame, thereby preventing a temperature rising of the bottom frame and loss of unnecessary consumption. Further, because the plate includes nickel (Ni) and zinc (Zn), the transformer can be stably operated. Also, the LCD module having the transformer utilizes a plate that is easily assembled.

It will be apparent to those skilled in the art that various modifications and variations can be made in a liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
a liquid crystal display panel;
a printed circuit board connected to the liquid crystal display panel;
a transformer connected to the printed circuit board, wherein the transformer comprises:
a bobbin including a hollow portion along a lengthwise direction thereof and being connected to the printed circuit board;
first and second lead substrates extending from first and second edges of the bobbin, respectively, the first and second lead substrates having a space therebetween where the plate is disposed; and
first and second E-cores inserted into the hollow portion from the first and second edges, respectively; and
a ferrite core plate disposed between the printed circuit board and the transformer.

2. The device according to claim 1, wherein the plate includes nickel (Ni) and zinc (Zn).

3. The device according to claim 1, wherein the transformer further comprises:
a primary coil and a secondary coil rolled on an outside of the bobbin; and
a primary lead pin and a secondary lead pin extending from the first and second lead substrates, respectively.

4. The device according to claim 3, wherein the first and second E-cores have an air gap therebetween when inserted into the hollow portion of the bobbin.

5. The device according to claim 4, wherein the plate is disposed between the bobbin and the printed circuit board so as to overlap the air gap.

6. The device according to claim 3, wherein the first and second E-cores have a center post directly inserted into the hollow portion.

7. The device according to claim 3, further comprising a plurality of coil sidewalls on the outside the bobbin.

8. The device according to claim 7, wherein each of the plurality of coil sidewalls has a ring shape.

9. The device according to claim 7, wherein at least one of the plurality of coil sidewalls has an extended portion so that a first distance between the extended portion and the printed circuit board is smaller than a second distance between each of the plurality of coil sidewalls.

10. The device according to claim 9, wherein the plate includes first and second plates, and the extended portion contacts a first position facing the first and second plates.

11. The device according to claim 10, wherein the first and second plates are closely adhered with each other at the first position.

12. The device according to claim 10, wherein the first and second plates have a concave portion so that the extended portion is inserted into the concave portion.

13. The device according to claim 9, wherein the plate has a plurality of concave portions having a same number as the plurality of coil sidewalls so that each of the plurality of coil sidewalls is inserted into each of the plurality of concave portions.

14. The device according to claim 3, wherein the first and second lead substrates contact both sides of the plate, respectively.

15. The device according to claim 1, further comprising:
a backlight unit disposed under the liquid crystal display panel;
a main frame supporting edges of the liquid crystal display panel and the back light unit;
a top frame supporting a front edge of the liquid crystal display panel; and
a bottom frame covering a backside of the backlight unit, the bottom frame being disposed adjacent to the transformer with the printed circuit board therebetween.

16. The device according to claim 15, further comprising at least one fluorescent lamp mounted on the backlight unit, and a backlight driving circuit board controlling a driving of the at least one fluorescent lamp and being mounted on the printed circuit board,
wherein the backlight driving circuit board includes the transformer.

* * * * *